United States Patent
Han

(10) Patent No.: US 7,537,999 B2
(45) Date of Patent: May 26, 2009

(54) METHOD FOR MANUFACTURING A CMOS IMAGE SENSOR

(75) Inventor: Chang Hun Han, Icheon-Si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 242 days.

(21) Appl. No.: 10/746,702

(22) Filed: Dec. 24, 2003

(65) Prior Publication Data
US 2005/0064665 A1 Mar. 24, 2005

(30) Foreign Application Priority Data
Sep. 23, 2003 (KR) .................. 10-2003-0065822

(51) Int. Cl.
*H01L 21/336* (2006.01)
(52) U.S. Cl. .................. 438/286; 438/60; 438/74; 438/199; 257/E21.085; 257/E27.133
(58) Field of Classification Search .......... 438/373, 438/57, 60, 289, 48, 199, 59, 63, 73, 75, 438/90, 197, 200, 229–232, 237, 286, 299, 438/FOR. 136, FOR. 139, FOR. 149, FOR. 213; 257/E21.532, E21.04, E21.085, E27.133, 257/E27.131
See application file for complete search history.

(56) References Cited

U.S. PATENT DOCUMENTS

| | | | | |
|---|---|---|---|---|
| 4,818,715 | A * | 4/1989 | Chao | 438/303 |
| 5,759,901 | A * | 6/1998 | Loh et al. | 438/305 |
| 5,841,126 | A | 11/1998 | Fossum et al. | |
| 5,886,659 | A | 3/1999 | Pain et al. | |
| 5,990,506 | A | 11/1999 | Fossum et al. | |
| 6,005,619 | A | 12/1999 | Fossum | |
| 6,021,172 | A | 2/2000 | Fossum et al. | |
| 6,184,055 | B1 * | 2/2001 | Yang et al. | 438/57 |
| 6,190,965 | B1 * | 2/2001 | Clampitt | 438/255 |
| 6,218,210 | B1 * | 4/2001 | Park | 438/57 |
| 6,323,626 | B1 * | 11/2001 | Raiser | 323/222 |
| 6,335,254 | B1 * | 1/2002 | Trivedi | 438/305 |
| 6,373,114 | B1 * | 4/2002 | Jeng et al. | 257/413 |
| 6,376,868 | B1 * | 4/2002 | Rhodes | 257/215 |
| 6,462,365 | B1 | 10/2002 | He et al. | |
| 6,849,886 | B1 | 2/2005 | Han | |
| 6,897,082 | B2 * | 5/2005 | Rhodes et al. | 438/48 |

(Continued)

OTHER PUBLICATIONS

Ju Il Lee, Jae Yoong Park: Method for Manufacturing Unit Pixal of Image Sensor Improving Doping Profile of Low Voltage Phote Diode; Korean Patent Abstract; Publication No. 1020010061356 A; Publication Date: Jul. 7, 2001; Korean Intellectual Property Office.

*Primary Examiner*—Matthew Smith
*Assistant Examiner*—Quovaunda Jefferson
(74) *Attorney, Agent, or Firm*—Andrew D. Fortney

(57) ABSTRACT

A method for manufacturing structures of a CMOS image sensor. The method comprises the steps of depositing a gate insulating layer and a conductive layer on a semiconductor substrate; depositing an ion implantation barrier layer on the conductive layer; patterning the deposited gate insulating layer, conductive layer and ion implantation barrier layer to form a patterned, composite gate insulating layer, gate electrode and ion implantation barrier structure; forming a second photosensitive layer pattern to define a photodiode region; and implanting low-concentration dopant ions into the substrate using the second photosensitive layer pattern as an ion implantation mask to form a low-concentration dopant region within the photodiode region.

21 Claims, 5 Drawing Sheets

U.S. PATENT DOCUMENTS

| | | | |
|---|---|---|---|
| 2001/0039068 A1* | 11/2001 | Lee et al. | 438/48 |
| 2003/0049896 A1* | 3/2003 | Chen et al. | 438/200 |
| 2003/0096443 A1* | 5/2003 | Hwang | 438/59 |
| 2003/0228736 A1* | 12/2003 | Kimura | 438/286 |
| 2005/0064620 A1 | 3/2005 | Han | |
| 2005/0064665 A1 | 3/2005 | Han | |
| 2005/0088556 A1 | 4/2005 | Han | |
| 2005/0093036 A1 | 5/2005 | Han | |

* cited by examiner

METHOD FOR MANUFACTURING A CMOS IMAGE SENSOR

BACKGROUND OF THE INVENTION

1. Field of the Invention

The present invention relates to a method for manufacturing a CMOS image sensor, and more particularly to method for manufacturing a CMOS image sensor in which ions implanted during formation of low-concentration n-type and p-type dopant regions for forming a photodiode are prevented from penetrating under a gate electrode, so that generation of a leakage current can be restrained.

2. Description of the Prior Art

In general, an image sensor is a semiconductor device for converting an optical image into an electrical signal, and is generally divided into CCD (Charge Coupled Device) and CMOS (Complementary Metal Oxide Semiconductor) image sensors.

The CCD is a device in which charge carriers are stored and transferred under the situation that each MOS capacitor is closely disposed to each other, while the CMOS image sensor is a device employing a switching mode of forming as many MOS transistors as the number of pixels using CMOS technology, which makes use of controlling and signal processing circuits as periphery circuits, to detect outputs using the MOS transistors.

The CCD has various disadvantages, such as complicated drive mode, much power consumption, impracticability or impossibility of fabricating a signal processing circuit in the same chip as the CCD due to many mask processes, and so on. Currently, in order to overcome these disadvantages, many studies have been made in the development of the CMOS image sensor using sub-micron CMOS manufacturing technology.

The CMOS image sensor obtains an image by forming a photodiode and a MOS transistor within a unit pixel to detect signals in a switching mode. As mentioned above, because the CMOS image sensor makes use of CMOS manufacturing technology, the CMOS image sensor has little power consumption as well as a simple manufacturing process requiring about 20 masks, compared with the CCD manufacturing process requiring 30 to 40 masks. As a result, the CMOS image sensor can integrate a signal processing circuit into a single chip, so that it is possible to make a product compact, thereby allowing for many applications.

Hereinafter, a description will be made regarding a construction of the CMOS image sensor. FIGS. 1 and 2 are a circuit diagram and a layout diagram showing a structure of a unit pixel of the conventional CMOS image sensor. For the sake of reference, the number of transistors constituting the CMOS image sensor is three or more. However, for the sake of convenience of description, the CMOS image sensor with three transistors alone will be mainly described.

As shown in FIGS. 1 and 2, a unit pixel 100 of the CMOS image sensor comprises a photodiode 110 as a means for sensing light and three NMOS (N-channel Metal Oxide Semiconductor) transistors. Among the three transistors, one is a reset transistor (Rx) 120, which functions not only to transfer optical charges generated from the photodiode 110 but also to discharge charges so as to detect signals, another is a drive transistor (Dx) 130, which functions as a source follower, and the third is a select transistor (Sx) 140, which performs switching and addressing functions.

Meanwhile, in the CMOS image sensor of the unit pixel, the photodiode 110 is designed to function as a source of the reset transistor (Rx) 120 in order to facilitate movement of the charges. To this end, in the course of manufacturing the image sensor of the unit pixel, a process of implanting low- or high-concentration dopant ions into a location including a part of the photodiode 110 is used as shown in FIG. 2. The manufacturing process will be described with reference to a cross-section taken along line A-A' of FIG. 2. For the sake of reference, the solid lines in FIG. 2 indicate a boundary or interface of an active region 160.

First, as shown in FIG. 3a, a gate insulation layer 122 and a gate electrode 123 are sequentially formed on a p-type semiconductor substrate 101, on which an element isolation layer 121 is completely formed using shallow trench isolation (STI) and the like. Here, even though not shown, a p-type epitaxial layer may be previously formed within the p-type substrate. Subsequently, a photosensitive layer is applied on the front surface of the substrate, and then a pattern for the photosensitive layer, which defines a region of the photodiode, is formed using a photolithography process. Here, the photosensitive layer pattern does not expose the gate electrode.

In this state, low-concentration dopant ions, for example n-type dopant ions, are implanted into the substrate, so that there is formed a low-concentration dopant region n− having a predetermined depth in the substrate.

Next, as shown in FIG. 3b, another photosensitive layer pattern 125 which does not expose the low-concentration (n−) dopant region is formed, and then another low-concentration dopant region 115 for an LDD structure is formed in a drain region of the electrode using the photosensitive layer pattern 125 as an ion implantation mask.

Subsequently, as shown in FIG. 3c, spacers 126 are formed on a side wall of the gate electrode, and then a p-type dopant region 110 ("p$^0$") is formed on the n-type dopant region n− and an n-type dopant region n+ is formed on the n(−)-type dopant region 115. Thereby, the process of forming the photodiode is completed. When the photodiode is finished, high-concentration dopant ions are selectively implanted to form a high-concentration dopant region n+ in the drain region of the gate electrode. As a result, the process associated with the cross-section taken along line A-A' of FIG. 2 is terminated.

According to the conventional method for manufacturing the CMOS image sensor, in order to increase a sensitivity of the CMOS image sensor, a depth of the low-concentration n-type dopant region n− for forming the photodiode is greater than a height of the gate electrode. That is, when the height of the gate electrode is about 2000 Å, the depth of the low-concentration n-type dopant region n− for forming the photodiode is set to about 3000 Å.

Meanwhile, a process of forming the low-concentration n-type dopant region n− for the photodiode (in a photodiode region defined by the gate electrode and the element isolating layer) is performed after the gate electrode is finished. Here, in order to prevent the low-concentration n-type dopant ions from being implanted into the active region below the gate electrode, the photosensitive layer pattern is formed over the gate electrode, but not over the photodiode region. At this time, one end of the photosensitive layer pattern is generally aligned to match with one end of the gate electrode.

The lithography process for forming the photosensitive layer pattern is composed of various unit processes, such as photoresist application, exposure, development, peeling, and so forth. An important factor for realizing a fine profile of the photosensitive layer is the exposure process. The exposure process makes use of ultraviolet (UV) or distant ultraviolet (DUV) rays as an exposure source, and exposes predetermined locations of the photosensitive layer to the rays. Recently, with high integration of semiconductor devices, a wavelength of the exposure source shows a tendency to be shortened. Presently, an I-line, which is broadly used as the exposure source, has a wavelength of 365 nm.

As mentioned above, when the photosensitive layer is patterned using the I-line as the exposure source, a deviation of about 0.15 μm is generated between an initially set profile and formed photosensitive layer pattern by influences such as the I-line irradiation wavelength (see FIG. 3d).

According to this technical basis, the photosensitive layer pattern, as an ion implantation mask, formed on the gate electrode during formation of the low-concentration n-type dopant region n− for the photodiode has one end, which may not be exactly matched with a corresponding end of the gate electrode, so that two ends show a difference of up to about 0.15 μm to each other.

Thus, during an actual ion implantation process, one end of the low-concentration n-type dopant region may not be exactly aligned with the corresponding end of the gate electrode, and implanted ions penetrate under the gate electrode pattern to a predetermined extent. This is because the photosensitive layer pattern exposes up to about 0.15 μm of the gate electrode, and the depth b of the low-concentration dopant region n− is larger than the height a of the gate electrode. Further, as mentioned above, the low-concentration dopant region n− may also penetrate under the gate electrode to a predetermined extent from an influence of subsequent annealing or heat treatment.

In this manner, as the low-concentration dopant region n− overlaps a lower region of the gate electrode, a channel under the gate electrode becomes shortened. As a result, short channel effects and possibly other detriments) are incurred, which can generate a leakage current.

SUMMARY OF THE INVENTION

Accordingly, the present invention has been made to solve the above-mentioned problems, and an object of the present invention is to provide a method for manufacturing a complementary metal oxide semiconductor (CMOS) image sensor, in which ions implanted during formation of low-concentration n-type and p-type dopant regions for a photodiode are prevented from penetrating under a gate electrode, so that generation of a leakage current can be restrained.

In order to accomplish this object, there is provided a method for manufacturing a complementary metal oxide semiconductor (CMOS) image sensor, comprising the steps of: forming a gate insulating layer and a conductive layer on a semiconductor substrate; forming a masking layer for preventing ion implantation on the conductive layer; patterning the masking layer, the conductive layer, and the gate insulating layer; forming a photoresist layer and then selectively patterning the photoresist layer to define a photodiode region; and implanting low-concentration dopant ions into the substrate using the photoresist layer pattern as an ion implantation mask to form a low-concentration dopant region within the photodiode region. In one embodiment, the masking layer for preventing ion implantation comprises an ion implantation barrier layer configured to prevent or inhibit ion implantation into a channel region below the conductive layer.

Preferably, the low-concentration dopant region has a depth greater than a height of the gate electrode.

Preferably, the conductive layer has a thickness between about 1500 and 2600 Å.

The low-concentration dopant region, preferably, has a depth between about 2500 and 3500 Å.

The insulating layer for preventing ion implantation preferably comprises an oxide layer and/or a nitride layer, more preferably a TEOS (Tetra Ethyl Ortho Silicate) based insulating layer.

Preferably, the method further comprises a step of implanting high-concentration dopant ions on the low-concentration dopant ion implantation layer after implanting the low-concentration dopant ions for the photodiode region, so as to reduce a dark current generated from a surface of the substrate.

Preferably, a p-type epitaxial layer is formed in the substrate before the gate insulating layer is deposited on the substrate.

According to the characteristic construction of the present invention, by forming an ion anti-implantation layer (an "ion implantation barrier layer") for restraining or preventing ion penetration into or through a gate electrode, when dopant ions for forming a subsequent low-concentration dopant region for a photodiode are implanted, even though a photosensitive layer pattern formed as an ion implantation mask is not exactly aligned with a gate electrode pattern or an ion implantation barrier layer pattern, the low-concentration dopant region formed by ion implantation is prevented from overlapping with a lower region (e.g., a channel) of the gate electrode.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
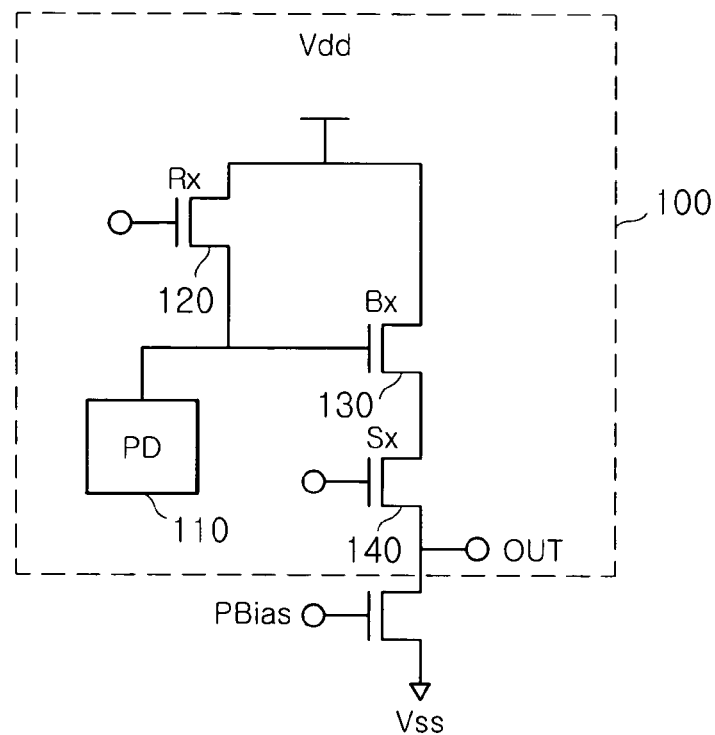
FIG. 1 is a schematic circuit diagram showing a structure of a unit pixel of the conventional CMOS image sensor.
Figure 2:
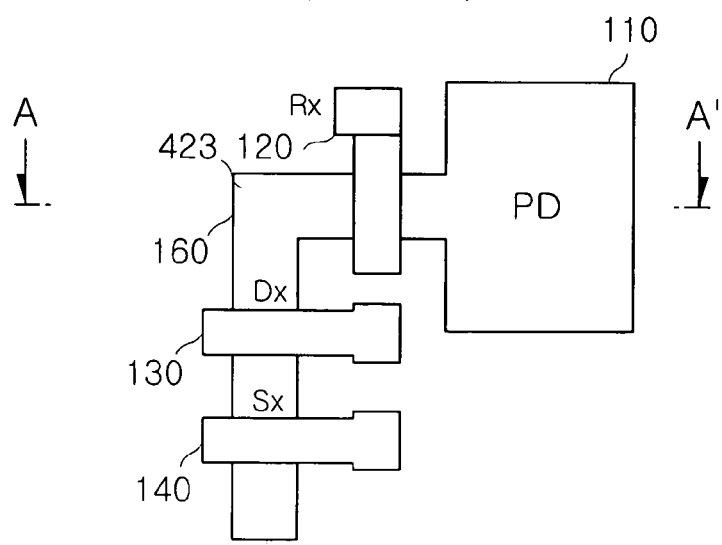
FIG. 2 is a layout diagram showing a unit pixel of the conventional CMOS image sensor.
Figure 3A:
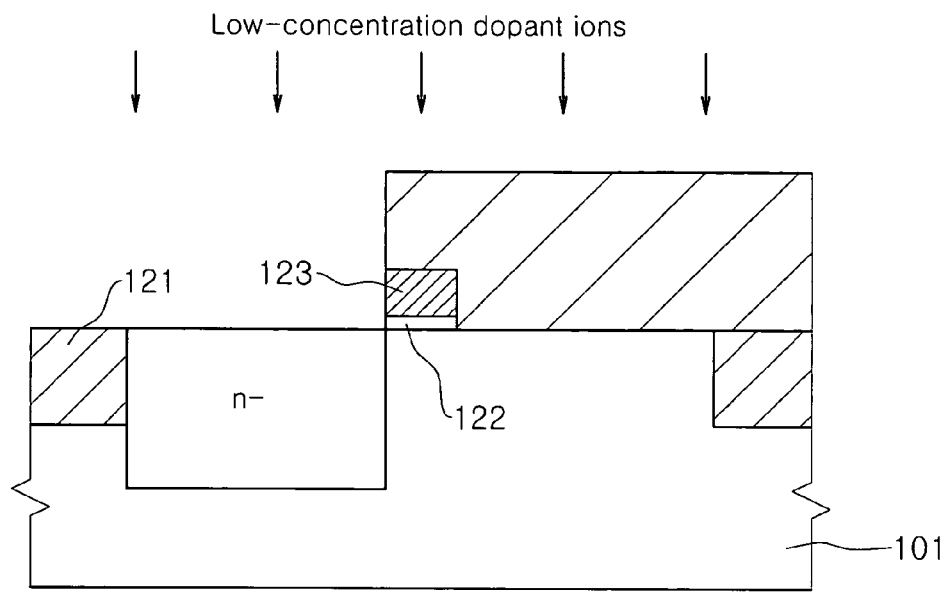
FIGS. 3a to 3d are process sectional views taken along line A-A' of FIG. 2.
Figure 3B:
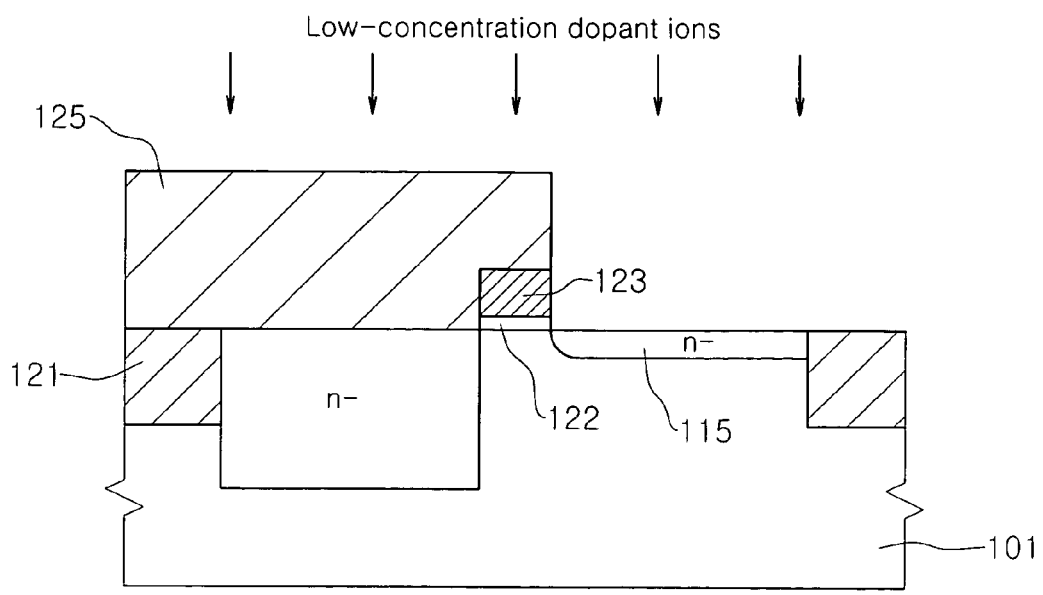
Figure 3C:
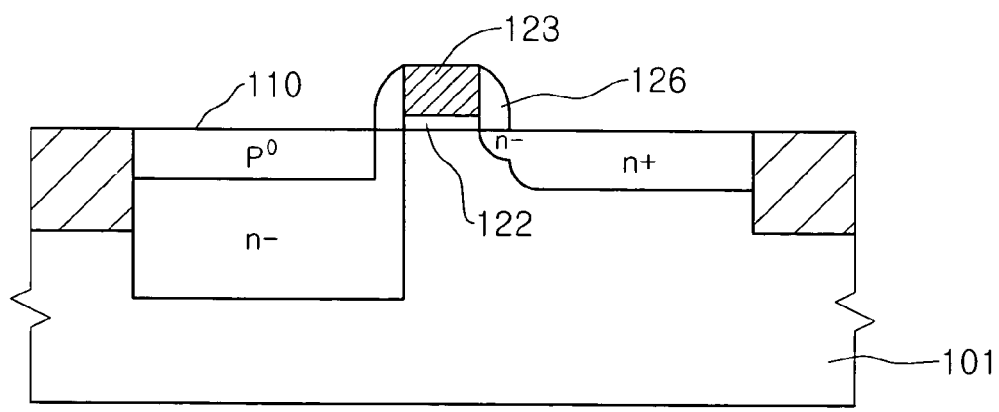
Figure 3D:
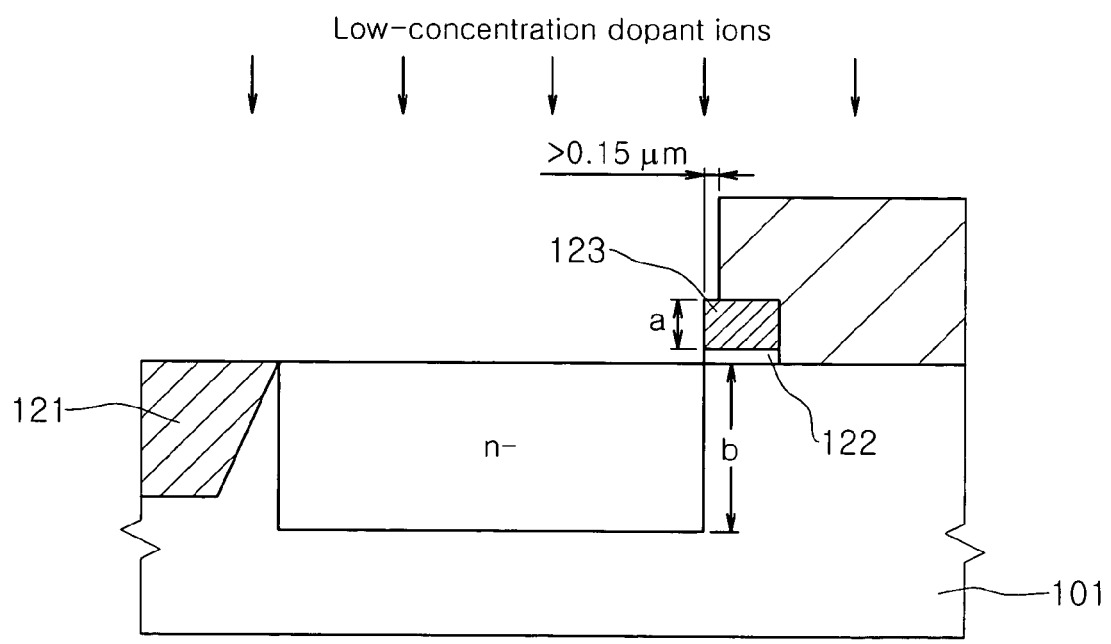

Hereinafter, a method for manufacturing a CMOS image sensor according to the present invention will be described in detail with reference to the accompanying drawings. FIGS. 4a to 4d are process sectional views for explaining a method for manufacturing a CMOS image sensor according to the present invention. Here, FIGS. 4a to 4d each correspond to a sectional view taken along line A-A' of FIG. 2.

Figure 4A:
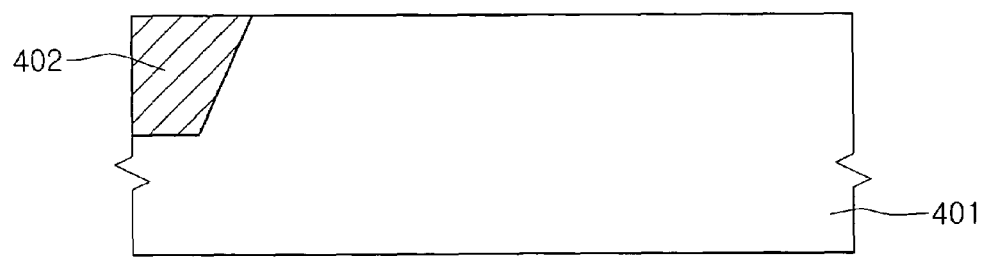
FIGS. 4a to 4d are process sectional views for explaining a method for manufacturing a CMOS image sensor according to the present invention.

First, as shown in FIG. 4a, in order to provide electrical insulation between active regions of a semiconductor substrate 401, for example a p-type single crystalline silicon substrate, an element isolating layer 402 is formed on a field region of the semiconductor substrate, for example by a shallow trench isolation (STI) process. Here, the element isolation layer 402 may be formed by another conventional isolation process other than the STI process, for example a local oxidation of silicon (LOCOS) process. Meanwhile, even though not shown in the drawings, a p-type epitaxial layer may be previously formed in or on the substrate.

Figure 4B:
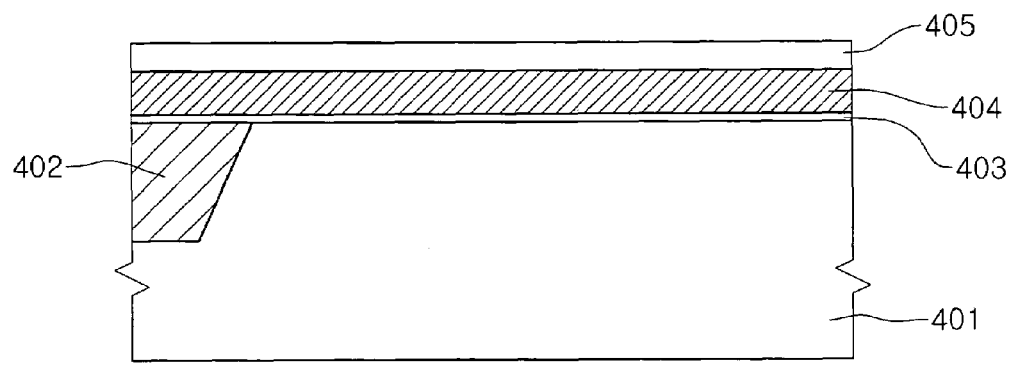

After the element isolating layer is formed, as shown in FIG. 4b, a gate insulating layer, for example, a gate oxide layer 403 is formed on the active region of the semiconductor substrate 401 at a thickness of about 100 Å using a thermal oxidation process or a low pressure chemical vapor deposition (LPCVD) process. Then, even though not shown in the drawing, in order to adjust a threshold voltage of a channel region to a desired value, threshold voltage adjusting ions may be conventionally implanted into the surface of the semiconductor substrate.

Subsequently, a conductive layer 404 for the gate electrode is deposited on the gate insulating layer 403, for example using a conventional LPCVD process. The conductive layer 404 may comprise a highly doped polycrystalline silicon layer alone, or a polycrystalline silicon layer and a conventional metal silicide layer thereon. Here, the conductive layer 404 preferably has a thickness of from 1500 to 2600 Å. In this state, an insulating layer 405 for forming an ion implantation barrier layer as a key component of the present invention is deposited on the conductive layer to a thickness, e.g., of from 700 to 1300 Å. The insulating layer 405 may comprise any insulating layer having a characteristic of restraining ion diffusion. For example, an oxide layer (such as silicon dioxide) and/or a nitride layer (such as silicon nitride) may be used, and particularly in the case of an oxide layer, a TEOS (Tetra Ethyl Ortho Silicate) based insulating layer may be used. Thus, in one embodiment, the step of forming the gate insulating layer, the conductive layer and the ion implantation barrier layer may comprise blanket depositing the conductive layer and the ion implantation barrier layer onto the gate insulating layer to form a composite gate electrode layer. Further, a thickness of the insulating implantation barrier layer 405 is preferably minimized to the difference between the depth of the low-concentration n-type dopant region n− for forming the photodiode and the height of the gate electrode pattern, or greater (e.g., such difference plus a predetermined standard deviation or maximum error).

Figure 4C:
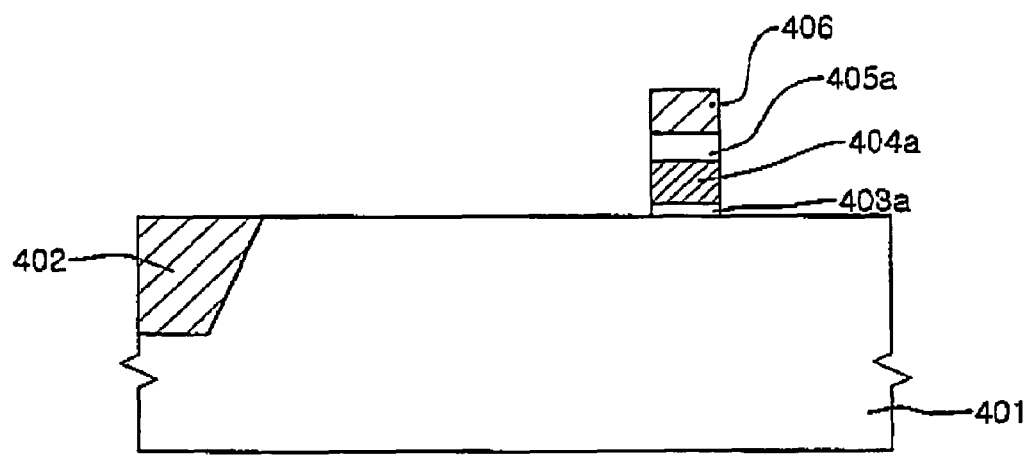

A photosensitive layer is deposited onto the insulating layer of the structure shown in FIG. 4c. The photosensitive layer is patterned using a photolithography process, so that a first photosensitive layer pattern 406 is formed at a location corresponding to the gate electrode pattern. Then, the insulating layer 405, the conductive layer 404, and the gate oxide layer 403, all of which are exposed, are sequentially etched and removed using the first photosensitive layer pattern 406 as an etching mask, thus forming an ion implantation barrier layer 405a, a gate electrode 404a and a gate insulating layer 403a. Finally, the first photosensitive layer pattern 406 is removed. Thus, in the present method, the step of patterning the ion implantation barrier layer, the conductive layer and the gate insulating layer may comprise depositing, selectively irradiating and developing a second photoresist on the composite gate electrode layer, then sequentially etching the ion implantation barrier layer, the conductive layer and the gate insulating layer.

Figure 4D:
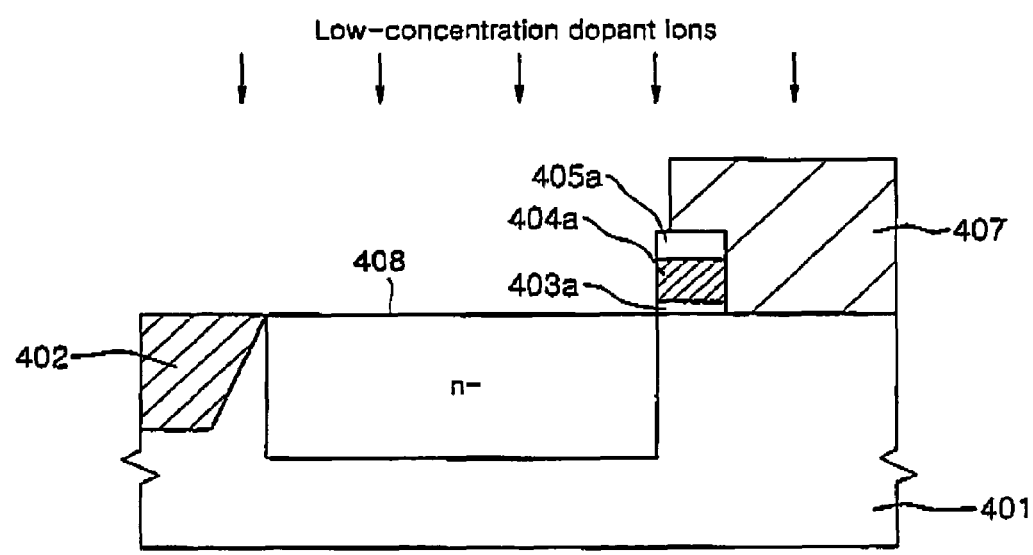

Then, as shown in FIG. 4d, a second photosensitive layer (in general, comprising a conventional photoresist material) is deposited onto the substrate, including the ion implantation barrier layer 405a. The photosensitive layer is selectively patterned until the photodiode region is exposed, forming a second photosensitive layer pattern 407. Here, as mentioned above, a process of patterning the photosensitive layer is performed in such a manner that radiation (such as UV or DUV rays) is allowed to pass through a photo mask corresponding to a fine circuit pattern onto a photosensitive layer at locations corresponding to the regions not to be implanted, and the photosensitive layer in the unexposed locations is removed. Here, in the case that the photosensitive layer is irradiated by a stepper using an I-line as the radiation source, even though the photosensitive layer is patterned to be exactly matched with the gate electrode, the photosensitive layer shows an error of up to about 0.15 µm or so (compared with initial design rules) by means of the I-line wavelength. Therefore, one end of the second photosensitive layer pattern 407 formed on the ion implantation barrier layer 405a may be formed at a position which is spaced apart from the corresponding end of the gate electrode 404a or the ion implantation barrier layer 405a by a distance of 0.15 µm or more. Thus, patterning the photoresist layer may prevent or inhibit ions from being implanted into a source/drain terminal region of a CMOS transistor comprising the gate electrode.

In this state, low-concentration n-type dopant ions are implanted throughout the substrate (a so-called "blanket implantation"). As the n-type dopant ions are implanted, they may form a p-n junction with the p-type epitaxial layer of the substrate, so that the photodiode is formed. Here, a low-concentration n-type dopant region n−, into which the low-concentration n-type dopant ions are implanted, has a predetermined depth from the surface of the substrate. The predetermined depth is larger than a height of the gate electrode 404a, but is smaller than the sum of the heights of the gate electrode 404a and the ion implantation barrier layer 405a. For example, it is preferable that the predetermined depth of the low-concentration n-type dopant region n− is from about 2500 to about 3500 Å. Setting the depth of the low-concentration n− type dopant region n−to be larger than the height of the gate electrode is believed to enhance a sensitivity of the CMOS image sensor.

Meanwhile, when the low-concentration n-type dopant ions are implanted, the ion implantation barrier layer 405a of an insulating material has been previously formed on the gate electrode 404a. For this reason, even though the second photosensitive layer pattern 407 formed on the ion anti-implantation layer 405a may not be exactly aligned with the gate electrode and the ion implantation barrier layer, the implanted dopant ions are prevented from penetrating under the gate electrode 404a. In other words, because of the ion implantation barrier layer 405a, when implanting low-concentration n-type dopant ions to form the photodiode 408, the photodiode region between the element isolating layer 402 and the gate electrode 404a can be self-aligned.

After the low-concentration n-type dopant region n− 408 is formed, the second photosensitive layer pattern 407 and ion implantation barrier layer 405a may be removed. In such a case, the ion implantation barrier layer acts as a sacrificial implant mask. Of course, if desired in subsequent processes, the ion implantation barrier layer may not be removed.

Subsequently, even though not shown in the drawing, the present method may further include a typical unit process of manufacturing the CMOS image sensor (e.g., a subsequent process such as implanting low-concentration dopant ions into a drain region to form a LDD structure). Thus, in one embodiment, the method further comprises the step of forming the source/drain terminal region of the CMOS transistor (s) in the unit pixel of the image sensor.

Meanwhile, the embodiment of the present invention as mentioned above has been described on the basis of a CMOS image sensor having three transistors. However, in terms of the technical spirit of the present invention of preventing the photodiode region from overlapping with the gate electrode region, it is natural that the embodiment of the present invention is equally applicable to all CMOS image sensors having three or more transistors.

Further, the embodiment of the present invention has been described on the basis of a p-type substrate, but it can be equally applied to an n-type substrate (in which case the dopant polarities are opposite).

The method for manufacturing the CMOS image sensor according to the present invention has the following effects.

By forming an ion implantation barrier layer for restraining ion penetration below a gate electrode, when dopant ions for forming subsequent low-concentration dopant regions for a photodiode are implanted, even though a photosensitive layer pattern formed as an ion implantation mask is not exactly aligned with a gate electrode pattern or an ion anti-implantation layer pattern, the low-concentration dopant region formed by ion implantation may be prevented from overlapping with a lower region of the gate electrode (e.g., its channel).

Thus, short channel effects may be prevented at the lower region of the gate electrode, or a channel region, thereby inhibiting or restraining generation of a leakage current in the ultimate image sensor. As a result, the process margin(s) for the gate electrode pattern can be reduced, so that it is possible to realize a more compact CMOS image sensor.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for manufacturing complementary metal oxide semiconductor (CMOS) image sensor structures, comprising the steps of:
    (a) forming a gate insulating layer, a conductive layer and an ion implantation barrier layer on a semiconductor substrate;
    (b) patterning said ion implantation barrier layer, said conductive layer, and said gate insulating layer;
    (c) forming a photoresist layer on said patterned ion implantation barrier layer, said conductive layer, and said gate insulating layer and patterning said photoresist layer to define a photodiode region in said substrate; and
    (d) implanting a low concentration of dopant ions into said photodiode region using said photoresist layer pattern and said patterned ion implantation barrier layer as an ion implantation mask to form a low-concentration dopant region of a photodiode,
    wherein said ion implantation barrier layer comprises an oxide layer and/or a nitride layer,
    wherein one end of the photoresist layer pattern is on said ion implantation barrier layer and another end of the photoresist layer pattern is not on said photodiode region,
    wherein the ion implantation barrier layer prevents the low-concentration dopant region from overlapping with a lower region of the gate electrode, and
    wherein a depth of said low-concentration dopant region is larger than a height of said conductive layer, but the depth of said low-concentration dopant region is smaller than a sum of the height of said conductive layer and a height of said ion implantation barrier layer.

2. The method as claimed in claim 1, wherein said conductive layer has a thickness between 1500 and 2600 Å.

3. The method as claimed in claim 1, wherein said low-concentration dopant region has a depth between 2500 and 3500 Å.

4. The method as claimed in claim 1, wherein said ion implantation barrier layer comprises a TEOS (Tetra Ethyl Ortho Silicate) based insulating layer.

5. The method as claimed in claim 1, further comprising a step of implanting a high concentration of dopant ions into the low-concentration dopant region after implanting said low concentration of dopant ions, so as to reduce a current generated by said image sensor.

6. The method as claimed in claim 1, further comprising forming a p-type epitaxial layer on or in said substrate before said gate insulating layer is formed on said substrate.

7. The method as claimed in claim 1, wherein the step of forming said gate insulating layer, said conductive layer and said ion implantation barrier layer comprises blanket depositing said conductive layer and said ion implantation barrier layer onto said gate insulating layer to form a composite gate electrode layer.

8. The method as claimed in claim 7, wherein the step of patterning said ion implantation barrier layer, said conductive layer, and said gate insulating layer comprises depositing, selectively irradiating and developing a second photoresist on said composite gate electrode layer, then sequentially etching said ion implantation barrier layer, said conductive layer and said gate insulating layer to form a gate electrode.

9. The method as claimed in claim 8, wherein the step of patterning said photoresist Layer prevents ions from being implanted into a source/drain terminal region of a CMOS transistor comprising said gate electrode.

10. The method as claimed in claim 9, further comprising the step of forming said source/drain terminal region of said CMOS transistor.

11. The method as claimed in claim 1, further comprising the step of removing said. ion implantation barrier layer after the step of implanting said low concentration of dopant ions into said photodiode region.

12. The method as claimed in claim 1, further comprising the step of implanting a high concentration of ions into said photodiode region.

13. The method as claimed in claim 1, wherein patterning the photoresist layer comprises forming one end of the photoresist layer pattern spaced apart from the corresponding end of the patterned conductive layer by at least an error of the radiation source.

14. The method as claimed in claim 1, wherein patterning the photoresist layer comprising forming the one end of the photoresist layer pattern spaced apart from the other end of the patterned gate electrode by 0.15 µm or more.

15. The method as claimed in claim 1, wherein the photoresist layer pattern inhibits ions from being implanted into a source/drain terminal region of a CMOS transistor comprising the patterned conductive layer.

16. The method as claimed in claim 1, wherein the photoresist layer pattern prevents ions from being implanted into a source/drain terminal region of a CMOS transistor comprising the patterned conductive layer.

17. The method as claimed in claim 16, further comprising implanting low-concentration dopant ions into a drain region of the CMOS transistor to form a LDD structure.

18. The method as claimed in claim 16, further comprising forming a source/drain terminal in the source/drain terminal region of the CMOS transistor.

19. The method as claimed in claim 1, wherein said ion implantation barrier layer has a thickness between 1100 and 1300 Å.

20. The method as claimed in claim 1, wherein patterning the photoresist layer exposes the entire photodiode region.

21. The method as claimed in claim 20, wherein patterning the photoresist layer further exposes the isolating layer.

* * * * *